United States Patent [19]

Nagano

[11] Patent Number: 4,591,739
[45] Date of Patent: May 27, 1986

[54] IMPEDANCE CONVERSION CIRCUIT

[75] Inventor: Katsumi Nagano, Shimonoseki, Japan

[73] Assignee: Tokyo Shibaura Denki Kabushiki Kaisha, Japan

[21] Appl. No.: 554,907

[22] Filed: Nov. 25, 1983

[30] Foreign Application Priority Data

Nov. 26, 1982 [JP] Japan ............................... 57-207166
Dec. 18, 1982 [JP] Japan ............................... 57-222453
Mar. 31, 1983 [JP] Japan ............................... 58-53526

[51] Int. Cl.$^4$ ........................... H03K 3/01; H03F 3/04
[52] U.S. Cl. ................................. 307/297; 307/493; 307/475; 330/288; 323/315
[58] Field of Search .................. 307/264, 297, 296 R, 307/490, 493, 475, 557; 330/288, 284, 282, 278; 323/313, 312, 315–317

[56] References Cited

U.S. PATENT DOCUMENTS 4,039,981  8/1977  Ohashi et al. ................. 307/264
4,057,743 11/1977  Limberg ...................... 307/296 R
4,278,946  7/1981  Kaplan ........................ 330/288
4,302,718 11/1981  Shade ......................... 307/296 R
4,498,001  2/1985  Smoot ......................... 330/288
4,507,573  3/1985  Nagano ........................ 330/288

OTHER PUBLICATIONS

Van Nostrand Reinhold Company, Linear Integrated Networks, Fundamentals, G. S. Moschytz, Chapter 5, pp. 258–259.

Primary Examiner—Stanley D. Miller
Assistant Examiner—Timothy P. Callahan
Attorney, Agent, or Firm—Finnegan, Henderson, Farabow, Garrett & Dunner

[57] ABSTRACT

An impedance conversion circuit is comprised of an NPN transistor of which the gate is supplied with an input voltage, a first current mirror circuit for supplying a current corresponding to the input voltage to the collector-emitter path of the NPN transistor, a second current mirror circuit which is controlled by a current supplied from the first current mirror circuit to feed back a current corresponding to the current to the gate of the transistor, a load connected between the emitter terminal of the NPN transistor and ground, and an output voltage being derived from the emitter of the NPN transistor.

15 Claims, 35 Drawing Figures

F I G. 19A
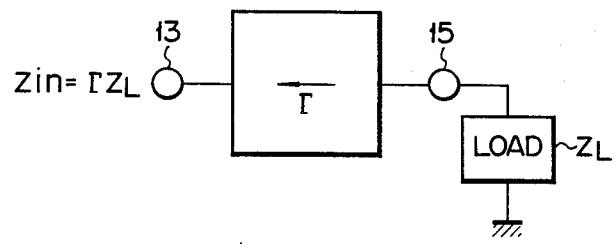
F I G. 19B
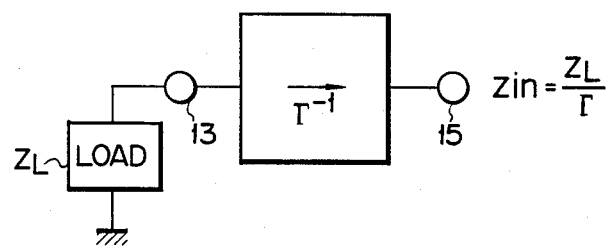
F I G. 20A
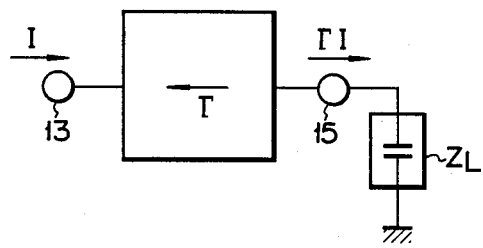
F I G. 20B
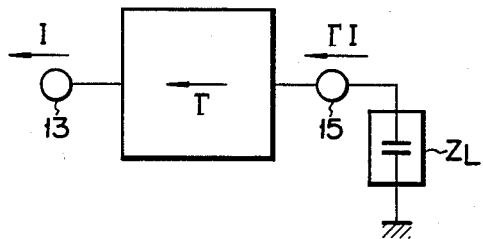

F I G. 21
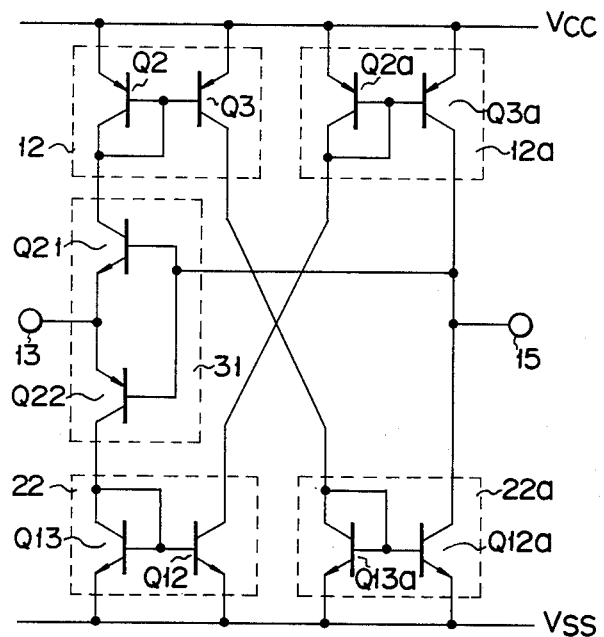
F I G. 22
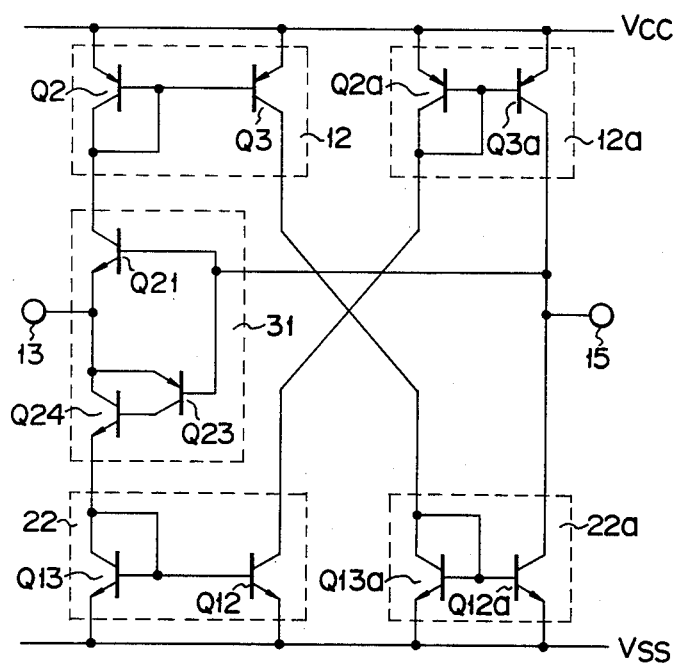

IMPEDANCE CONVERSION CIRCUIT

BACKGROUND OF THE INVENTION

The present invention relates to an impedance conversion circuit with an input impedance proportional to a load impedance and well adaptable in fabrication for integrated circuits of the bipolar transistor type.

In a four-terminal network as shown in FIG. 1, the following transfer determinant holds $$\begin{pmatrix} V1 \\ I1 \end{pmatrix} = \begin{pmatrix} A & B \\ C & D \end{pmatrix} \begin{pmatrix} V2 \\ I2 \end{pmatrix} \quad (1)$$

where V1 is an input voltage, I1 an input current, V2 an output voltage, and I2 an output current. A circuit of which the determinant as expressed above is conditioned as, $A \neq 0$, $B = C = 0$ and $D \neq 0$, is called an impedance conversion circuit. Also in FIG. 1, Vin is an input voltage, Zs an input impedance and $Z_L$ a load impedance.

Recently, many types of circuits have been fabricated into integrated circuits. With this trend, it has been desired that the impedance conversion circuit be fabricated into the integrated circuit constructed of the bipolar transistors. So far as we know, there has not been realized any four-terminal network which satisfieds the above condition for the impedance conversion circuit and is adaptable in fabrication for the bipolar transistor type integrated circuit.

SUMMARY OF THE INVENTION

Accordingly, an object of the present invention is to provide an impedance conversion circuit of the bipolar transistor type, which is well adaptable in fabrication for the integrated circuits.

Another object of the present invention is to provide an impedance conversion circuit which is well adaptable in fabrication for integrated circuits and can use a current signal for an input signal.

A further object of the present invention is to provide an impedance conversion circuit which is well adaptable in fabrication for integrated circuits and can effect a bidirectional impedance conversion.

According to the invention, there is provided an impedance conversion circuit comprising a voltage-current converter which responds to an input voltage to produce a current proportional to the input voltage, a first current mirror circuit for supplying a current corresponding to said input voltage to said voltage-current converter, a second current mirror circuit which is controlled by a current supplied from said first current mirror circuit to feed back a current corresponding to said current to the input terminal, a load connected between the output terminal of said voltage-current converter and ground, and an output voltage according to an impedance of said load being derived from a connection point between said voltage-current converter and said load.

According to the invention, there is further provided an impedance conversion circuit comprising a pair of voltage-current converters which receive differential input voltages and produce currents proportional to said input voltages, a pair of first and second current mirror circuits connected between a first power source and said voltage-current converters for supplying currents corresponding to said input voltages to said voltage-current converters, first and second constant current sources connected between said voltage-current converters and said second power source, third and fourth current mirror circuits connected at ends to said second power source, which are controlled by currents fed from said first and second current mirror circuits, and feed back currents corresponding to said current to the input terminals of said voltage-current converters, third and fourth constant current sources for feeding current to the input terminals of said voltage-current converters, and a load connected between a connection point between one of said voltage-current converters and a connection point between the other voltage-current converter and said second constant current source, an output voltage according to an impedance of said load being derived from across said load.

According to the invention, there is still further provided an impedance conversion circuit comprising an input terminal and an output terminal, an input circuit with first, second and third terminals, said first terminal being connected to said input terminal, said second terminal being connected to said output terminal, said second terminal providing a voltage corresponding to a voltage applied to said first terminal, said third terminal feeding a current corresponding to a current input to said first terminal, a first current mirror circuit which is supplied with the current derived from said third terminal in said input circuit and providing a current proportional to the input current, and a second current mirror circuit which is supplied with the current from said first current mirror circuit and produces a current proportional to the input current, the output of said second current mirror circuit being connected to said output terminal.

According to the invention, there is further provided an impedance conversion circuit comprising a complimentary emitter follower circuit in which an NPN transistor and a PNP transistor are interconnected at the emitters and the bases, a first terminal connected to an emitter interjunction of said complimentary emitter follower circuit, a second terminal connected to a base interjunction of said complimentary emitter follower circuit, a first constant current source circuit of which the input terminal is connected to the collector circuit of said NPN transistor in said complimentary emitter follower circuit, and of which the output terminal provides a current corresponding to the input current, a second constant current source circuit of which the input terminal is connected to the collector circuit of said PNP transistor in said complimentary emitter follower circuit, and of which the output terminal provides a current corresponding to the input current, a third constant current source circuit of which the input terminal is connected to the output terminal of said second constant current source circuit, and the output terminal is connected to said second terminal and provides a current corresponding to the input current, a fourth constant current source circuit of which the input terminal is connected to the output terminal of said first constant current source circuit, the output terminal is connected to said second terminal and provides a current corresponding to the input current, and a load connected to one of said first and second terminals, the other of those terminals being applied with an input voltage while providing an output according to an impedance of said load.

According to the invention, there is still further provided an impedance conversion circuit comprising a complimentary emitter follower circuit in which an NPN transistor and a PNP transistor are interconnected at the emitters and the bases, a first terminal connected to an emitter interjunction of said complimentary emitter follower circuit, a second terminal connected to a base interjunction of said complimentary emitter follower circuit, a first constant current source circuit of which the input terminal is connected to the collector circuit of said NPN transistor in said complimentary emitter follower circuit, and of which the output terminal provides a current corresponding to the input current, a second constant current source circuit of which the input terminal is connected to the collector circuit of said PNP transistor in said complimentary emitter follower circuit, and of which the output terminal provides a current corresponding to the input current, a third constant current source circuit of which the input terminal is connected to the output terminal of said second constant current source circuit, and the output terminal provides a current corresponding to the input current, a fourth constant current source circuit of which the input terminal is connected to the output terminal of said first constant current source circuit, the output terminal is connected to a third terminal and provides a current corresponding to the input current, a voltage comparator circuit for comparing the voltages at said first terminal and said third terminal, and applies to said second terminal a signal according to the result of the comparison, and a load connected to one of said first and third terminals, the other of those terminals being applied with an input voltage while providing an output according to an impedance of said load.

BRIEF DESCRIPTION OF THE DRAWINGS

FIGS. 19A and 19B show block diagrams of the FIGS. 17 and 18 circuits, respectively;

FIGS. 20A and 20B are block diagrams of modifications of the FIG. 17 circuit when it is modified into such that current is fed into the input terminal and the current is derived from the input terminal;

FIGS. 21 and 22 are circuit diagrams of other embodiments of the present invention;

DETAILED DESCRIPTION OF THE PREFERRED EMBODIMENTS

Figure 1:
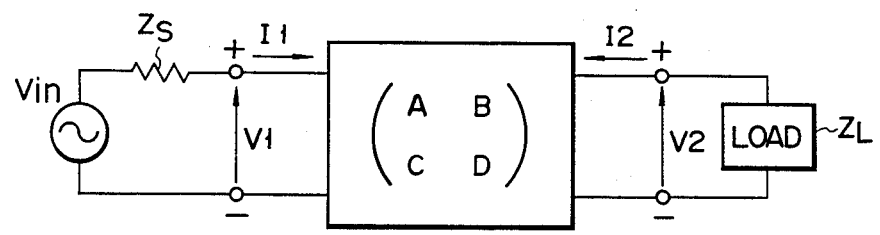
FIG. 1 illustrates an impedance conversion circuit expressed in the form of a four-terminal network.
Figure 2:
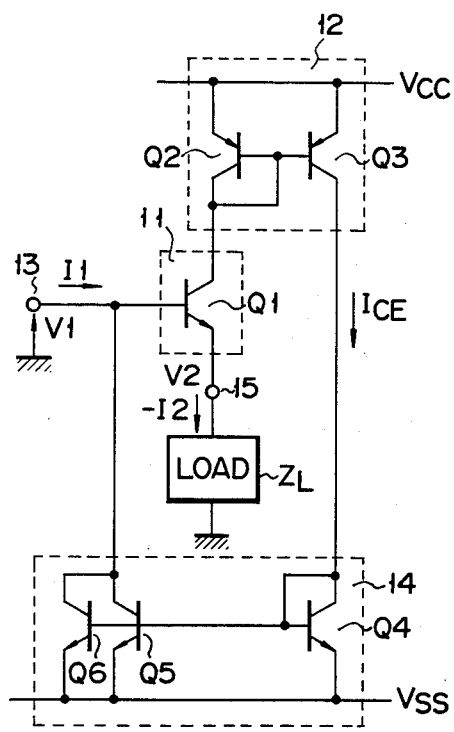
FIG. 2 illustrates a circuit diagram of an impedance conversion circuit of the voltage input type according to the present invention.

Referring to FIG. 2, there is shown an embodiment of an impedance conversion circuit according to the present invention. A first current mirror circuit 12 composed of a couple of PNP transistors Q2 and Q3, which are provided between an NPN transistor Q1 and a positive power source Vcc. The base of the transistor Q1 is connected to an input terminal 13 which is applied with an input voltage V1 and an input current I1. The collector of the same transistor is connected to the collector of the transistor Q2, and the emitter to an output terminal 15. A load with an impedance $Z_L$ is connected between the output terminal 15 and ground. The emitters of the transistors Q2 and Q3 are both connected to the positive power source Vcc. The bases of the transistors Q2 and Q3 are interconnected. The base of the transistor Q2 is connected to the collector of the transistor itself. A second current mirror circuit 14 is composed of three NPN transistors Q4 to Q6 is provided between the first current mirror circuit 12 and a negative power source Vss. The collector of the transistor Q4 is connected to the collector of the transistor Q3 and to the base of the transistor itself. The emitter of the same transistor is connected to the negative power source Vss. The collectors of the transistors Q5 and Q6 are both connected to the input terminal 13, while the emitter thereof to the negative power source Vss. The bases of the transistors Q4 to Q6 are interconnected. With such an arrangement, the collector-emitter current $I_{CE}$ of the transistor Q3 of the current mirror circuit 12 is input to the collector of the transistor Q4 of the second current mirror circuit 14. A current corresponding to the collector-emitter current of the transistor Q4 in the second current mirror circuit 14 is fed back to the base of the transistor Q1. An output voltage V2 is derived from the emitter of the Q1, i.e. the output terminal 15.

With such an arrangement, when the input voltage V1 is applied to the impedance 13, the base voltage of the transistor Q1 is V1. At this time, the output voltage V2 is equal to the result of the subtraction of the base-emitter voltage $V_{BE}$ from the input voltage V1. The output voltage V2 and the output current I2 are given by the following equations (2) and (3)

$$V1 = V2 + V_{BE} \quad (2)$$

$$-I2 = \frac{V2}{Z_L} = \frac{V1 - V_{BE}}{Z_L} \quad (3)$$

If the common base current amplification factor $\alpha$ of the transistor Q1 is "1", the collector current of the transistor Q1 is equal to the output current I2. Assuming that the current transfer ratios of the current mirror circuits 12 and 14 are respectively r12 and r14, the input current I1 is given $$I1 = -r12 \cdot r14 \cdot I2 \quad (4)$$

Therefore, if the input voltage V1 is much larger than the base-emitter voltage $V_{BE}$ of the transistor Q1, the input voltage V1 is nearly equal to the output voltage V2, and $$V1 \simeq V2$$

and the transfer determinant is given by $$\begin{pmatrix} V1 \\ I1 \end{pmatrix} = \begin{pmatrix} 1 & 0 \\ 0 & -r12 \cdot r14 \end{pmatrix} \begin{pmatrix} V2 \\ I2 \end{pmatrix} \quad (5)$$

$$A = 1, B = 0$$
$$C = 0, D = r12 \cdot r14 \neq 0$$

The above determinant satisfies the requirements for the impedance conversion circuit as given by the relation (1).

In the FIG. 2 circuit, since the transfer ratios r12 and r14 of the current mirror circuits 12 and 14 are: r12=1 and r14=2, the transfer determinant is $$\begin{pmatrix} V1 \\ I1 \end{pmatrix} = \begin{pmatrix} 1 & 0 \\ 0 & -2 \end{pmatrix} \begin{pmatrix} V2 \\ I2 \end{pmatrix} \quad (6)$$

Figure 3:
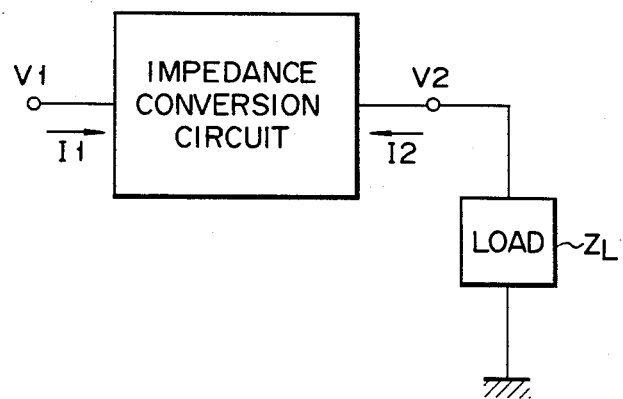
FIG. 3 illustrates a block diagram of the FIG. 2 circuit.

The impedance conversion circuit shown in FIG. 2 can be expressed by a block diagram as shown in FIG. 3. As shown in FIG. 3, the circuit shown in FIG. 2 is equivalent to a circuit formed when the terminal voltage at either the input terminal or the output terminal in the FIG. 2 circuit is set at ground potential. In the circuit arrangement shown in FIG. 2, the input impedance is proportional to the load impedance. The current fed back to the input terminal 13 can be set to a proper value by changing an emitter area ratio of the transistors Q2 and Q3 forming the current mirror circuit 12 and that of the transistors Q4 to Q6 forming the second current mirror circuit 14, viz. the current transfer ratios r12 and r14. In this way, an impedance conversion circuit with a desired impedance conversion characteristic can be formed.

Figure 4:
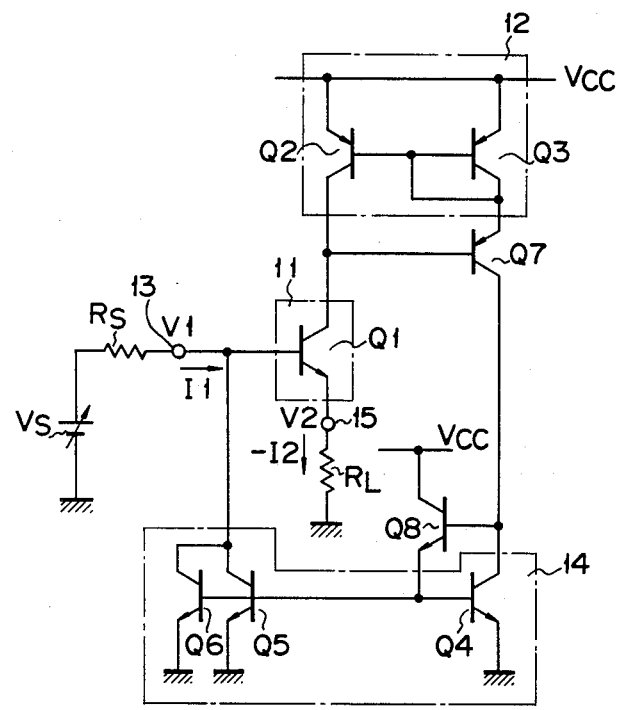
FIG. 4 is a circuit diagram of a test circuit for testing the FIG. 2 circuit.

A test circuit shown in FIG. 4 was formed for testing a dynamic characteristic of the circuit shown in FIG. 2. In FIG. 4, a variable DC power source Vs variable between 0 V and 10 V is used for a power source for input voltage V1 application. The power source Vs is connected to the input terminal 13 through an input resistor Rs (1 kilo ohms). A resistor $R_L$ of 1 kilo ohms is used for the load $Z_L$. A PNP transistor Q7 and an NPN transistor Q8 are provided for compensating for the output currents of the current mirror circuits 12 and 14, respectively. The collector-emitter path of the transistor Q7 is inserted into the connection line between the transistors Q3 and Q4. The transistor Q7 is connected at the emitter to the collector of the transistor Q3, at the collector to the collector of the transistor Q4, and at the base to the collectors of the transistors Q1 and Q2. The transistor Q8 is connected at the emitter to the positive power source Vcc, at the emitter to the bases of the transistors Q4 to Q6, and at the base to the collectors of the transistors Q7 and Q4. The positive power source Vcc is set at 10 V, Vcc=10 V. The current transfer ratios of the current mirror circuits 12 and 14 are respectively set at 1 and 2, i.e. r12=1 and r14=2. In the impedance conversion circuit shown in FIG. 4, the following relations (7) and (8) hold $$Vs = RsI1 + V_{BE} + R_L I2 \quad (7)$$

$$I1 = -2I2 \quad (8)$$

The resistors Rs and $R_L$ have both 1 kilo ohms and hence these resistors are designated by R. Then, we have $$Vs = -3RI2 + V_{BE} \quad (7')$$

The input voltage V1 is $$V1 = Vs - RI1 = Vs + 2RI2 \quad (9)$$
$$= Vs - \frac{2R}{3R}(Vs - V_{BE})$$
$$= \frac{1}{3} Vs + \frac{2}{3} V_{BE}$$

If the base-emitter voltage of the transistor Q1 is negligible, the input voltage V1 is ⅓ of the voltage Vs, as seen from the relation (9). This case corresponds to a case that half the load resistor $R_L$, i.e. having 500 ohms, is connected to the input terminal 13. The output voltage V2 is $$V2 = -RI2 = \tfrac{1}{3}(Vs - V_{BE}) \quad (10)$$

Figure 5:
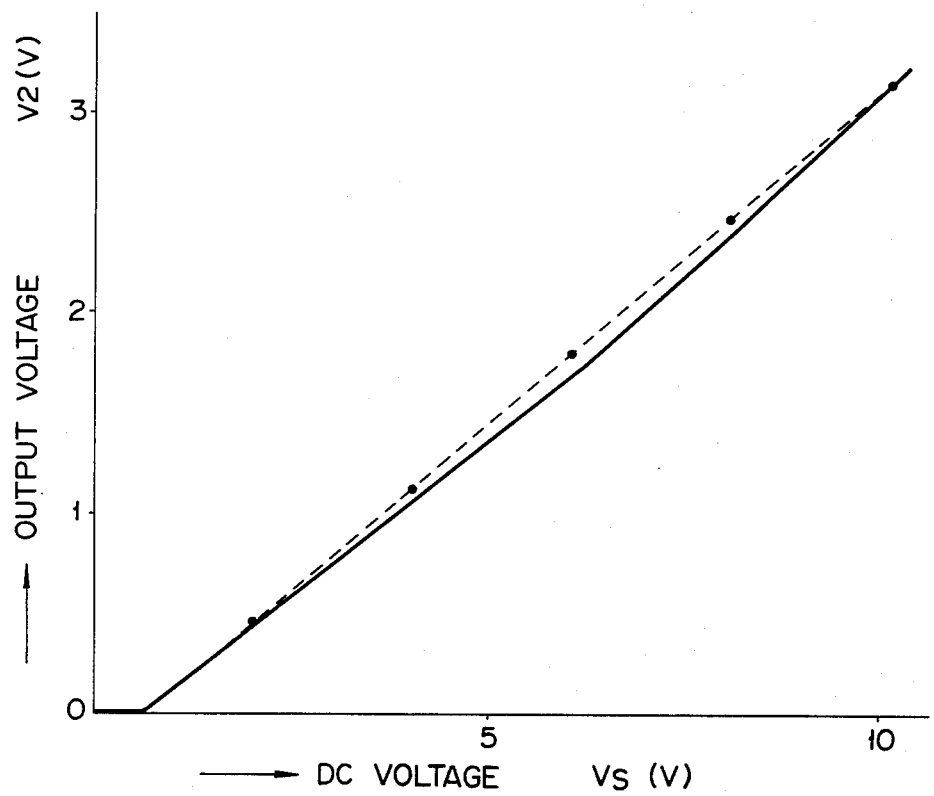
FIG. 5 is a graphical representation of a relationship between an input voltage vs. an output voltage in the test circuit of FIG. 4.

FIG. 5 graphically illustrates the output voltage V2 against a variation of the variable DC power source Vs. In the graph, a solid curve indicates a variation of measured values, while a broken curve a variation of theoretical values as given by the equation (10).

In the transfer determinant of (5), if the load impedance is $Z_L$, $$\frac{V2}{-I2} = Z_L \quad (11)$$

The input impedance Zin as viewed from the input side of the FIG. 4 impedance conversion circuit, is $$Zin = \frac{V1}{I1} = \frac{V2}{-r12 \cdot r14 \cdot I3} = \frac{Z_L}{r12 \cdot r14} \quad (12)$$

As seen from the above equation, the input impedance Zin is proportional to the load impedance $Z_L$.

Figure 6:
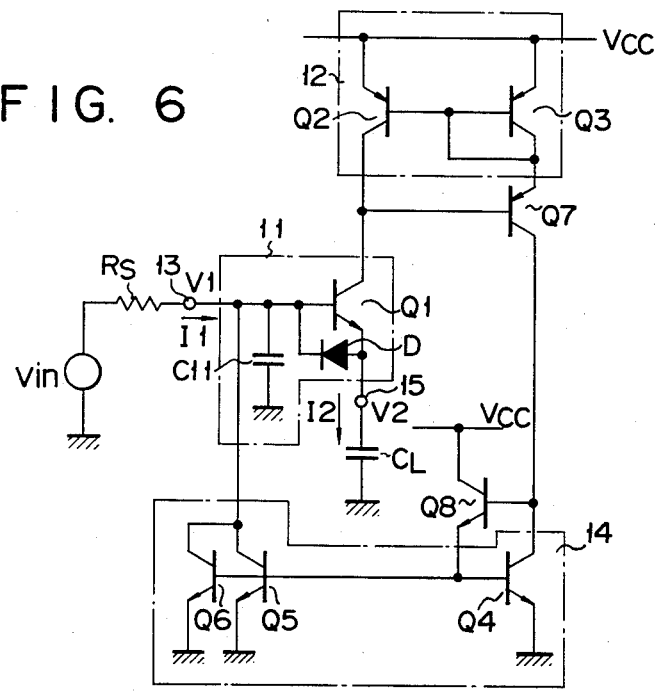
FIG. 6 is a circuit diagram illustrating another embodiment of the present invention.

The circuit arrangement of FIG. 6 is a modification of the FIG. 4 circuit arrangement in that a capacitor $C_L$, in place of the resistor R1, is used for the load 16. Reference character $C_L$ is doubly used for indicating the load capacitor and its value. Because of the use of the capacitor $C_L$, a diode D is provided between the emitter and the base of the transistor Q1, for the purpose of providing a discharge path to the charges stored in the capacitor $C_L$. In this modification, a closed loop is formed with a connection that the transistor Q1 is connected at the emitter to the cathode of the diode D and at the base to the anode of the diode D. The closed loop possibly causes an oscillation in this circuit. For preventing this, a capacitor C11 is connected between the base of the transistor Q1 and ground. The remaining circuitry in this modification is the same as the corresponding one in the FIG. 4 circuit arrangement. Therefore, no further explanation thereof will be given using like reference symbols applied to the like or equivalent portions in FIG. 4.

The input impedance Zin is $$Z_{in} = \frac{1}{j\omega C_L \cdot r12 \cdot r14} \quad \left(j = \sqrt{-1}\right) \tag{13}$$

This equation indicates that the load capacitor $C_L$ is r12·r14 times that of the FIG. 4 embodiment. Therefore, if r12·r14=2, the load capacitance of the circuit is two times that of the actually connected capacitor $C_L$. Therefore, a large time constant can be obtained using a small capacitive capacitor.

Figure 7A:
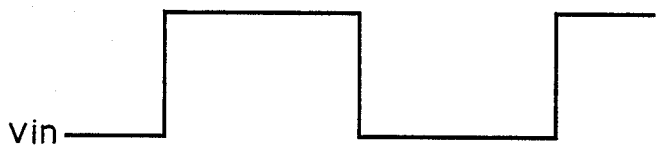
FIGS. 7A and 7B illustrate waveforms of input and output voltages in the FIG. 6 circuit.
Figure 7B:

FIG. 7A shows a waveform of the input voltage Vin, and FIG. 7B a waveform of the output voltage V2 appearing at the output terminal 15 when the circuit is applied at the input terminal with the input voltage Vin. In this modification, for the pulsative input voltage applied, the impedance conversion is active during the charging period of the capacitor $C_L$, while it is inactive during the discharging period. For this reason, the waveform of the output voltage V2 gently rises and sharply falls, as shown in FIG. 7B. A time constant of the input and output voltages V1 and V2 is $2R_sC_L$, while that at the fall time is $R_sC_L$. This feature of the embodiment under discussion that a large time constant can be obtained using a small capacitance, implies that if this embodiment is applied for a low pass filter, for example, which needs a large capacitive capacitor, the pattern area can be reduced, contributing to the increase of the integration density. In the FIG. 6 circuit, when Rs=1 kilo ohms and $C_L=0.1$ μF, the time constant measured at the rise and fall times of the output voltages V2 were 0.23 msec and 0.12 msec, respectively. Note here the time constant at the rise time is substantially two times that at the fall time.

Figure 8:
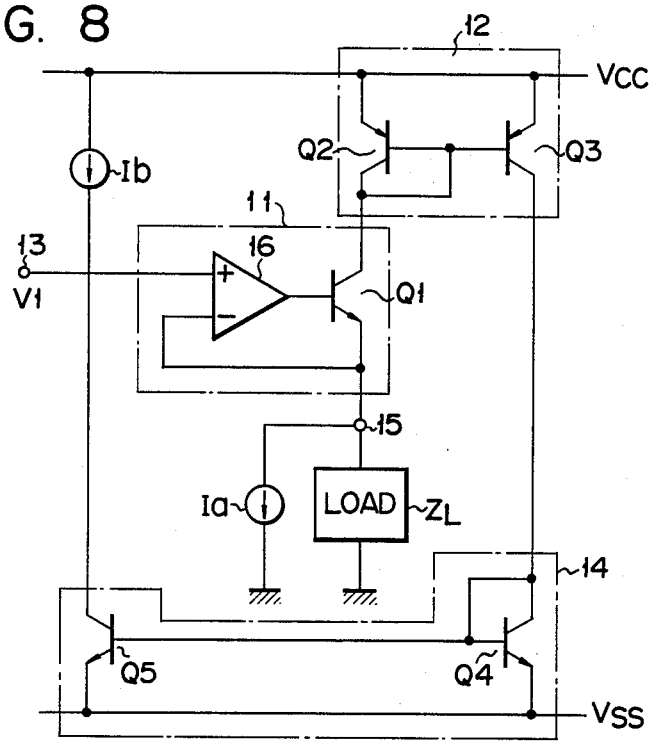
FIGS. 8 through 10 are circuit diagrams of other embodiments of the present invention.

FIG. 8 shows another embodiment of an impedance conversion circuit according to the present invention. In the embodiments shown in FIGS. 2, 4 and 6, the output voltage V2 contains an error of the base-emitter voltage $V_{BE}$ of the transistor Q1, as seen from the equation (2). The FIG. 8 embodiment is designed so as to remove this error. In the present embodiment, the voltage-current converter 11 is comprised of a NPN transistor Q1 of which the collector-emitter path is connected between the first current mirror circuit 12 and the load impedance $Z_L$, and an operational amplifier 16 which is connected at the non-inverting input terminal (+) to the input voltage V1 and at the inverting input terminal (−) to the emitter voltage of the transistor Q1, and at the output terminal to the gate of the transistor Q1. The operational amplifier 16 controls the transistor Q1 by the output voltage of the amplifier. A DC current source Ia for discharging the charges stored in the load impedance $Z_L$ is connected between the output terminal 15 and ground. A DC current source Ib is connected between the positive power source Vcc and the input terminal 13. The DC current source Ib is for correcting a reduction of the output voltage V2 caused by the DC power source Ia. Both the constant current sources Ia and Ib have substantially the same characteristics. With such an arrangement, the transistor Q1 is controlled by the result of the comparison between the emitter voltage and the input voltage V1. Therefore, the output voltage V2 does not contain the error due to the base-emitter voltage $V_{BE}$.

Figure 9:
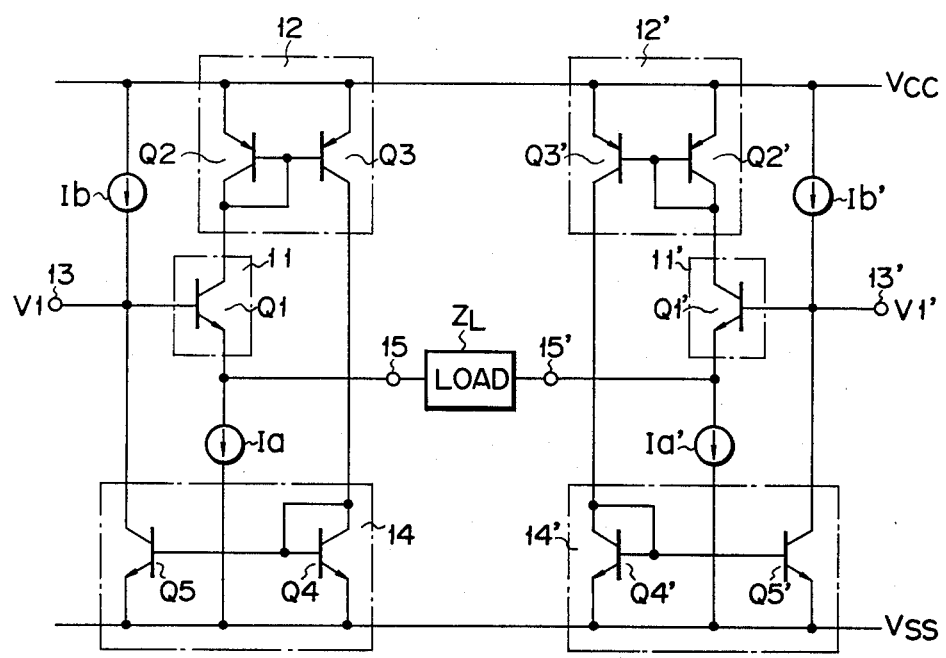
Figure 10:
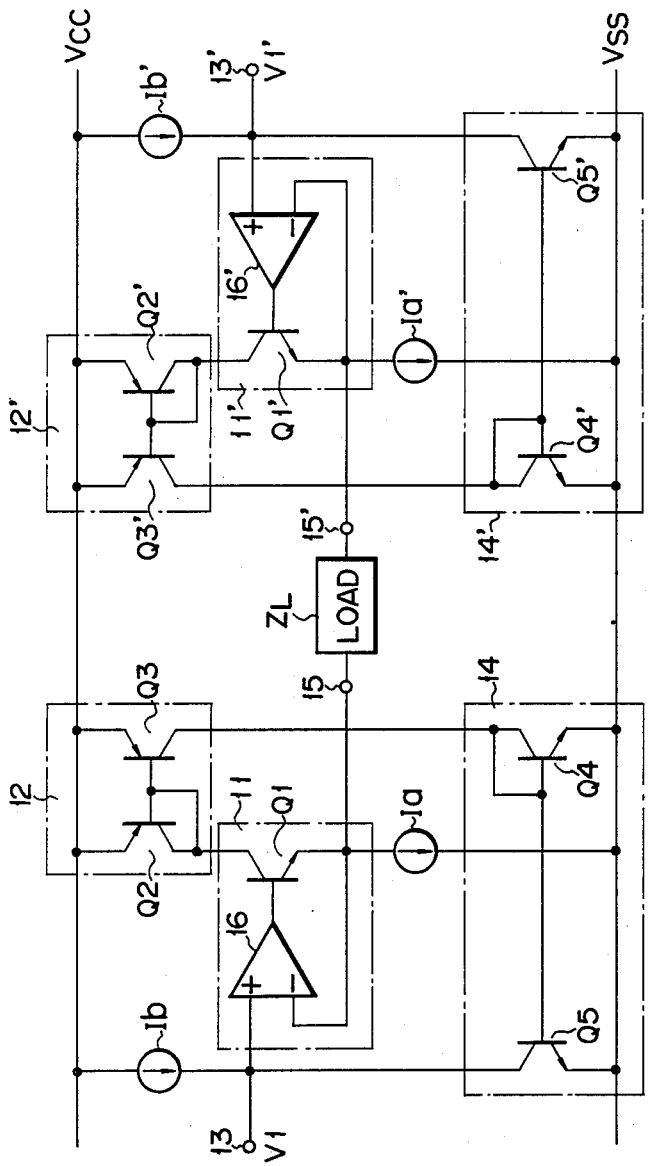

FIGS. 9 and 10 illustrate other embodiments of an impedance conversion circuit accordng to the present invention. While in the embodiments as described above, one end of the load impedance is grounded, in the FIGS. 9 and 10 embodiments, the load impedance $Z_L$ floats from ground. The FIG. 9 embodiment corresponds to a circuit in which a couple of the FIG. 2 circuits are symmetrically coupled with each other. In one circuit of the symmetrically coupled circuit pair, like reference symbols are used for the like or equivalent portions in FIG. 2, while the same symbols but primed are applied to the corresponding portions in the other circuit. For simplicity, the explanation to follow will be directed to one of the circuit pair. In the circuit, an NPN transistor Q1, constituting the current-voltage converter 11, is connected at the gate to an input voltage V1 through the input terminal 13, and produces an output current proportional to the input voltage V1. A current mirror circuit 12 is made up of a pair of PNP transistors Q2 and Q3. A constant current source Ia is provided between the voltage-current converter 11 and the negative power source Vss. Another current mirror circuit 14 is comprised of NPN transistors Q4 and Q5 of which the emitters are connected to the negative power source Vss. The output of the current mirror circuit 12 is coupled with the current mirror circuit 134. The output current of the current mirror circuit 14 is fed back to the base of the transistor Q1. Another constant current source Ib is connected between the positive power source Vcc and the NPN transistor Q1. The constant current source Ib feeds a constant current to the base of the transistor Q1. The same thing is correspondingly applied to the other circuit. A load impedance $Z_L$ is connected between the output terminals 15 and 15' of the circuit pair which are respectively coupled with the transistors Q1 and Q1'.

With such an arrangement, a proper load impedance can be obtained in a floatng state between the input terminals 13 and 13'.

The FIG. 10 embodiment is also designed so that a couple of the FIG. 8 circuits are combined, thereby to float the load impedance $Z_L$ from ground, as in the case of the FIG. 9 circuit. In this circuit arrangement, one of the circuit pair uses like symbols for designating like portions in FIG. 8. In the other circuit, like symbols but primed are used for the like portions in the former circuit. A load impedance $Z_L$ is connected between the terminals 15 and 15'. The FIG. 10 embodiment can attain similar effects to those of the FIG. 9 embodiment. The output voltage V2 does not contain the error due to the base-emitter voltage $V_{BE}$.

The impedance conversion circuits of FIGS. 2, 4, 6 and 8–10 are suitable for the integrated circuits fabrication.

Figure 11:
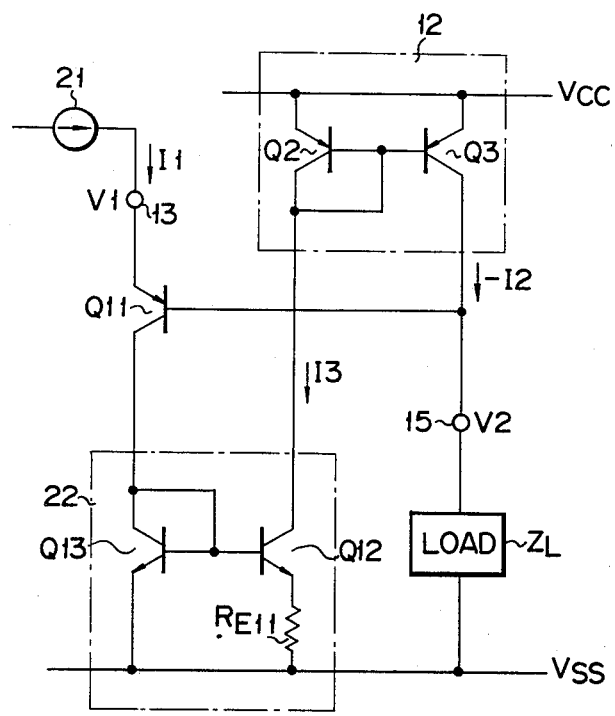
FIG. 11 is a circuit diagram of another embodiment of the present invention of the current input type.

Turning now to FIG. 11, there is shown an embodiment of an impedance conversion circuit of the current input type according to the present invention. As shown, a DC constant current source 21 is connected to the input terminal 13. The output terminal 15 is connected to the collector of the transistor Q3. The emitter of an input PNP transistor Q11 is connected to the input terminal 13. The base of the transistor Q11 is connected to the output terminal 15. The collector of the transistor Q11 is connected to the collector of an NPN transistor Q13 which, together with an NPN transistor Q12, makes up a current mirror circuit 22. In the current mirror circuit 22, the transistors Q12 and Q13 are interconnected at the bases. The collector and the base of the transistor Q13 are shortcircuited. The emitter of the transistor Q13 is connected to the negative power source Vss, and the emitter of the transistor Q12 is connected through an emitter resistor $R_{E11}$ to the negative power source Vss. The collector of the transistor Q12 is connected to the collector of the PNP transistor Q2. The transistor Q2, together with the PNP transistor Q3, form a current mirror circuit 12. The bases of the transistors Q2 and Q3 are interconnected. The collector and base of the transistors Q2 and Q3 are shortcircuited. The emitters of the transistors Q2 and Q3 are both connected to the positive power source Vcc. The collector of the transistor Q3 is connected to the output terminal 15. These transistors Q12 and Q13 in the current mirror circuit 22 have substantially the same emitter areas. Similarly, the emitter areas of the transistors Q2 and Q3 have substantially the same emitter areas.

With such an arrangement, if the common base amplification factor $\alpha$ of the PNP transistor Q11 is about 1, the collector current is approximately equal to the emitter current, i.e. the input current I1 from the input current source 21. Accordingly, the current equal to the input current I1 is input to the current mirror circuit 22. Its output current I3 is proportional to the input current I1. The current I3 is applied as the input current to the current mirror circuit 12. The current mirror circuit 12 produces a current I2 proportional to the input current I3. The current I2 is applied to the load impedance $Z_L$ through the output terminal 15.

Assume now that the current transfer ratios of the current mirror circuit 22 are r1 and r2, the current flowing into the input terminal 13 has a positive polarity, and the current fowing out of the output terminal 15 has a negative polarity. On this assumption, the output current I2 is $$-I2 = r1 \cdot r2 \cdot I1 \quad (14)$$

The voltage V2 at the output terminal 15 is given by the product of the load impedance $Z_L$ and the current I2

$$V2 = -I2 \cdot Z_L \quad (15)$$

When the voltage V2 at the output terminal 15 is defined by the relation (15), the voltage V1 at the input terminal 13 is given by $$V1 = V2 + V_{BE} \quad (16)$$

As seen from the above equation, the voltage V1 is the sum of the voltage V2 and the base-emitter voltage $V_{BE}$ of the transistor Q11. If the base-emitter voltage $V_{BE}$ is much smaller than the voltage V2, the voltage V1 is substantially equal to the votage V2. On the assumption that the above condition is satisfied, the equations (14) and (15) may be written into a transfer determinant corresponding to the determinant (1)

$$\begin{pmatrix} V1 \\ I1 \end{pmatrix} = \begin{pmatrix} 1 & 0 \\ 0 & -1/r1 \cdot r2 \end{pmatrix} \begin{pmatrix} V2 \\ I2 \end{pmatrix} \quad (17)$$

In the above relation, A≠0, D≠0, and B=C=0. Hence, the determinant satisfies the requirements for the impedance conversion circuit as described referring to the equation (1).

Figure 12:
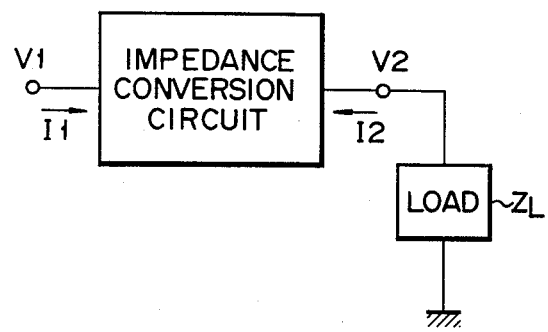
FIG. 12 is a block diagram of the FIG. 11 circuit.

The impedance conversion circuit shown in FIG. 11 can be expressed by a block diagram containing of a four-terminal circuit, as shown in FIG. 12. This block diagram is the same as that of the block diagram of FIG. 3. That is to say, the FIG. 11 circuit may be expressed by the block diagram of FIG. 3. As seen from the block diagram of FIG. 12, the FIG. 11 circuit is equivalent circuit equal to a circuit in which one of the input and output terminals of the four-terminal circuit is connected to the negative power source Vss. Thus, an input impedance Zin proportional to the load impedance $Z_L$ of the load circuit connected to the output terminal 15 can be obtained. Further, by changing the resistor $R_{E11}$ to cause the current transfer ratio r1 of the current mirror circuit 22 to change, the output current I2 can be changed. This implies that an impedance conversion circuit with a desired impedance characteristic may be obtained by setting the emitter resistor $R_{E11}$ to an appropriate value.

Figure 13:
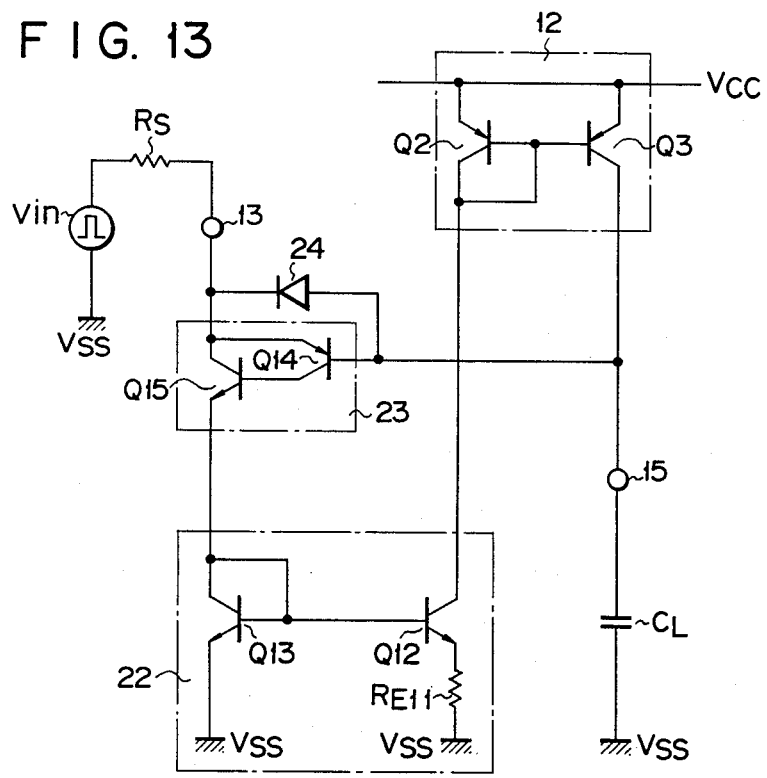
FIG. 13 is circuit diagram of a test circuit for testing the FIG. 11 circuit.

FIG. 13 shows a test circuit formed for testing a dynamic characteristic of the FIG. 11 circuit. In this circuit, a pulse voltage source Vin is connected to the input terminal 13 through an input resistor Rs of resistance 1 kilo ohms. A capacitor $C_L$ of 0.1 µF is used as the load impedance $Z_L$ connected to the output terminal 15. In place of the input PNP transistor Q11, an input circuit 23 is used which is made up of a PNP transistor Q14 and an NPN transistor Q15. It is for this reason that since the PNP transistor Q11, when it is fabricated into the integrated circuit, generally takes a lateral structure, the current amplification factor is small, and therefore the collector current is not equal to the emitter current. In the input circuit 23, the emitter of the PNP transistors Q14 is connected to the collector of the NPN transistor Q15, and the collector of the PNP transistor Q14 is connected to the base of the NPN transistor Q15. A junction point between the emitter of the PNP transistor Q14 and the collector of the NPN transistor Q15 is coupled with the input terminal 13. The base of the PNP transistor Q14 is connected to the output terminal Q13. The emitter of the NPN transistor Q15 is connected to the collector of the NPN transistor Q13. In the input circuit 23, the current amplification factor of the NPN transistor Q15 is set at a sufficiently large value, so that the current input to the input terminal 13 flows out of the emitter of the NPN transistor Q15. A potential difference between the input and output terminals 13 and 15 when the input current flows into the input terminal 13 is equal to the base-emitter voltage $V_{BE}$ of the PNP transistor Q14, as in the case of the FIG. 11 circuit. Since the capacitor $C_L$ is used for the load circuit, a diode 24 for providing a discharge path for the charges stored in the capacitor $C_L$ is connected in parallel to the base-emitter path of the transistor Q14. The diode 24 is connected at the anode to the base of the PNP transistor Q14, and at the cathode to a junction between the emitter of the PNP transistor Q14 and the collector of the NPN transistor Q15.

In the impedance conversion circuit with such an arrangement, the capacitor $C_L$ as the load is charged at the rise time of the input pulse Vin, the discharged through the diode 24 at the fall time. In this circuit, the input impedance as seen from the input terminal 13 is given by the following expression (18)

$$Zin = \frac{1}{j\omega \frac{C_L}{r1 \cdot r2}} \quad (18)$$

The emitter areas of the NPN transistors Q12 and Q13, constituting the current mirror circuit 22, are equal to each other. Since the emitter resistor $R_{E11}$ is connected to the NPN transistor Q12, the current transfer ratio r1 is smaller than 1. Further, the emitter areas of the PNP transistors Q2 and Q3, forming the current mirror circuit 12, are equal to each other. Then, the current transfer ratio r2 of the current mirror circuit 12 is 1. An apparent value of the capacitor $C_L$ as viewed from the input side of the circuit is larger than an actual value, and is $C_L/r1$. Therefore, the input impedance Zin of this circuit is expressed $$Zin = \frac{1}{j\omega \frac{C_L}{r1}} \quad (19)$$

In the FIG. 13 circuit, although the capacitor $C_L$ is actually connected as the load impedance $Z_L$, when the circuit is seen from the input terminal 13, the circuit has a capacitance of r1·r2 where r1 is larger than 1. Therefore, a large time constant is obtained using a small capacitor.

Figure 14A:
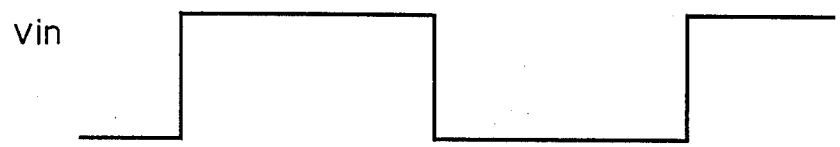
FIGS. 14A and 14B illustrate waveforms of input and output voltages in the test circuit of FIG. 13.
Figure 14B:
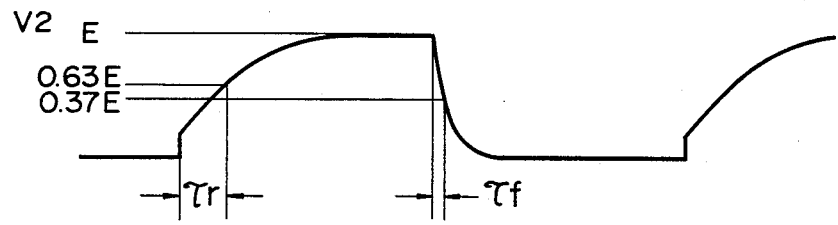
Figure 15:
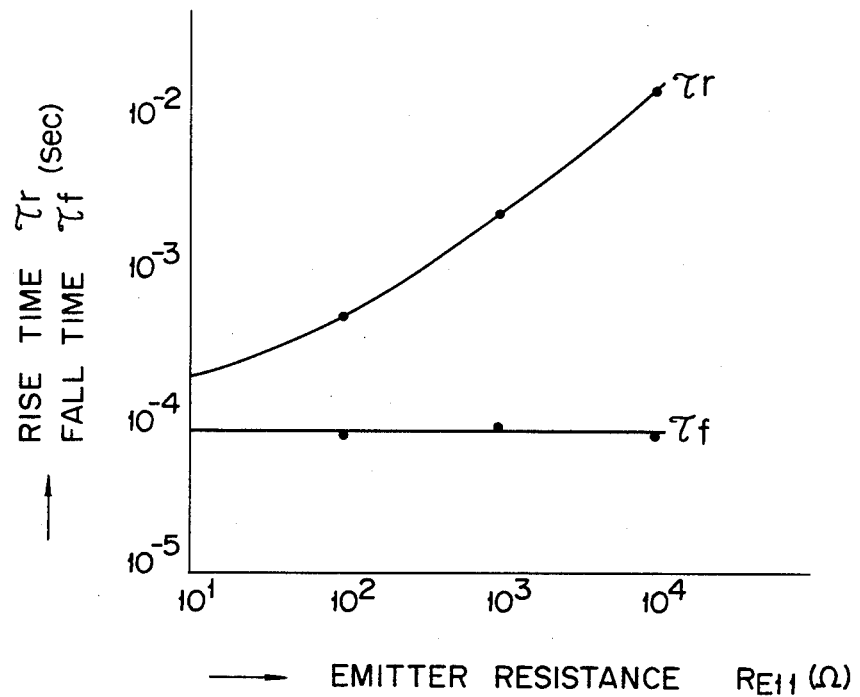
FIG. 15 illustrates a graphical representation of rise time and fall time with respect to emitter resistance in the test circuit of FIG. 13.

FIG. 14A shows a voltage waveform of the input pulse Vin, and FIG. 14B is a volage waveform of the output voltage V2 appearing at the output terminal. FIG. 15 depicts a variation of the time constant $\tau r$ and $\tau f$ at the rise and fall times of the input voltage V2 with respect to a change of the emitter resistor $R_{E11}$ in the current mirror circuit 22. As seen from the FIG. 15 curves, as the emitter resistor $R_{E11}$ is increased, the time constant $\tau r$ at the rise time of the voltage V2 increases. The reason for this is that, as described above, an apparent value of the capacitor $C_L$ is larger as the current transfer ratio r1 is smaller, and with this the input impedance Zin further grows. At the fall time, the charges stored in the capacitor $C_L$ is discharged through the diode 24 and then the time constant $\tau f$ takes a fixed value as defined by the capacitor $C_L$ and the input resistance Rs. In the circuit of FIG. 13, since the input resistance Rs is 1 kilo ohms and the capacitor $C_L$ is 1 $\mu$F, $\tau r = 10^{-4}$ sec, or 0.1 msec.

A strict proportional relationship does not hold between the emitter resistor $R_{E11}$ and the current transfer ratio r1 in the current mirror circuit 22. Therefore, it is impossible to obtain an exact value of the apparent magnification on the capacitor $C_L$, using the characteristic curve in FIG. 15. However, the following approximation holds $$M = \frac{\tau r}{\tau f} \quad (20)$$

The magnification M is theoretically expressed by $M = 1/r1$. When the emitter resistor $R_{E11}$ is 100 ohms, the FIG. 15 curve gives that the M is approximately 6.3. When the emitter resistor $R_{E11}$ is 1 and 10 kilo ohms, M is about 24 and 175. These values teach that the magnification M may be set at large by increasing the emitter resistor $R_{E11}$. Thus, the FIG. 11 impedance conversion circuit can obtain a large time constant using a small capacitive capacitor $C_L$. This fact indicates that if this impedance conversion circuit is applied for circuits with relatively large capacitor such as low-path filters, the pattern area may effectively be reduced and hence an integration density is increased.

Figure 16:
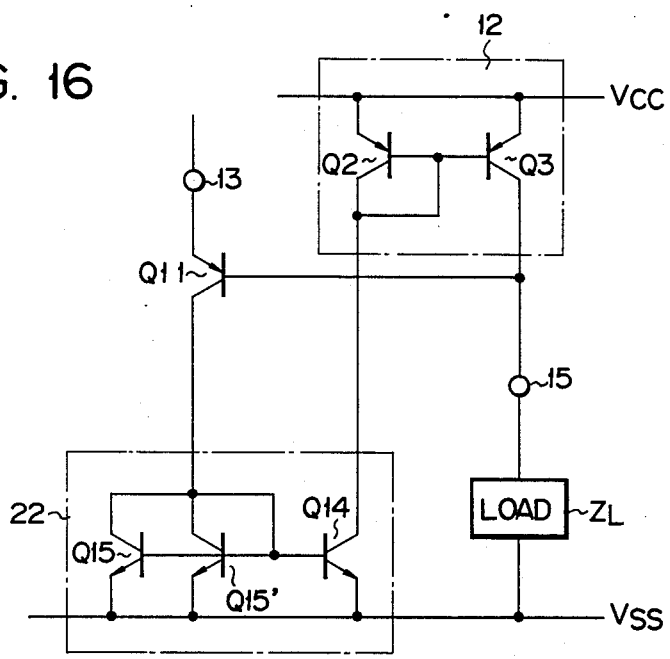
FIG. 16 is a circuit diagram of yet another embodiment of the present invention.

FIG. 16 shows another embodiment of an impedance conversion circuit according to the present invention. In the FIG. 11 embodiment, the emitter resistor $R_{E11}$ is used for setting the current transfer ratio r1 of the current mirror circuit 22 to a value less than 1. In the present embodiment, the same purpose is attained in a manner that the emitter area of the input transistor of the current mirror circuit 22 is selected to be larger than that of the output NPN transistor Q14. More specifically, an input NPN transistor Q15 is connected in parallel to an NPN transistor Q15' with the same size. The total emitter area of the input NPN transistors Q15 and Q15' is selected to be two times the emitter area of the output NPN transistor Q14. In this way, the current transfer ratio r1 of 0.5 is obtained. Therefore, in this embodiment, the capacitance as seen from the input side of the circuit is two times the capacitance of the actual capacitor $C_L$.

In the embodiments of FIGS. 11, 13, and 16, for increasing the impedance as seen from the input side, the current transfer ratio r1 in the current mirror circuit 22 is set below 1. Alternatively, the current transfer ratio r2 of the current mirror circuit 12 may be set below 1 or the current transfer ratios r1 and r2 of both the current mirror circuits may be set below 1. For obtaining a large time constant, the current transfer ratios r1 and r2 are selected such that an overall current transfer ratio r1·r2 of the current mirror circuits 22 and 12 is below 1.

Further, by appropriately selecting the current transfer ratios r1 and r2 such that the overall current transfer ratio r1·r2 of the current mirror circuits 22 and 12 is larger than 1, an input impedance may be obtained which is proportional to the load impedance $Z_L$ but is smaller than that.

The embodiments of FIGS. 11, 13, and 16 are suitable for the integrated circuit fabrication, and can handle a current signal for an input signal.

Figure 17:
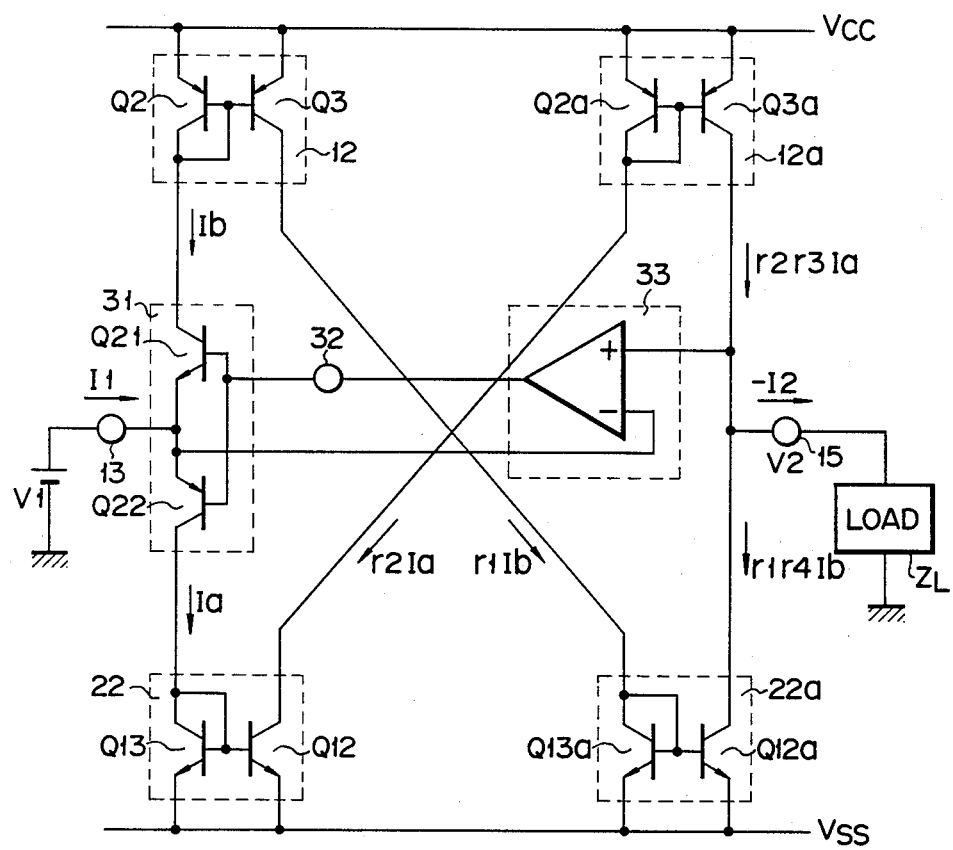
FIG. 17 is a circuit diagram of an impedance conversion circuit with a current bidirectionality which is further embodiment of the present invention.

FIG. 17 shows yet another embodiment of an impedance conversion circuit according to the present invention. The impedance conversion circuit in this embodiment has a current bidirectionality.

An NPN transistor Q21 and a PNP transistor Q22 make up an emitter follower circuit 31. The emitters of the transistors Q21 and Q22 are interconnected and the bases of these transistors are also interconnected. The emitter interjunction point is connected to the input terminal 13, and the base interjunction point to an internal terminal 32. The inverting input terminal (−) of a voltage comparator 33 is connected to the input terminal 13, and the non-inverting input terminal (+), to the output terminal 15. The voltage comparator 33 compares the input voltage V1 of the input terminal 13 with the output voltage V2, and produces a logical level signal based on the result of the comparison. The output signal is input to the emitter follower circuit 31 through the internal terminal 32. The collector of the NPN transistor Q21 in the emitter follower circuit 31 is connected to the collector (current input terminal) of the PNP transistor Q2 is the first current mirror circuit 12. The collector of the PNP transistor Q22 is connected to the collector (current input terminal) of the NPN transistor Q13 in the second current mirror circuit 22. The collector (current input terminal) of a PNP transistor Q2a which, together with a PNP transistor Q3a, forms a third current mirror circuit 12a, is connected to the collector (current output terminal) of the NPN transistor Q12 in the second current mirror circuit 22. The collector (current output terminal) of the PNP transistor Q3a in the third current mirror circuit 12a is connected to the output terminal 15. The collector (current input terminal) of the NPN transistor Q13a which, together with the NPN transistor Q12a, makes up a fourth current mirror circuit 22a, is connected to the collector (current output terminal) of the PNP transistor in the first current mirror circuit 12. The collector (current output terminal) of the NPN transistor Q12a in the fourth current mirror circuit 22a is coupled with the output terminal 15. The transistors Q2a, Q3a and Q3 in the current mirror circuit 12a are connected together to the positive power source Vcc. The emitters of the transistors in the current mirror circuit 22 are connected together to the negative power source Vss.

The first and third current mirror circuits 12 and 12a are constructed using PNP transistors and these transistors are connected to the high potential power source Vcc. Therefore, an output current flowing out of the output terminal has a value corresponding to an input signal applied to the input terminal. The second and fourth current mirror circuits 22 and 22a are constructed using NPN transistors and these transistors are connected to the negative power source Vss. Therefore, an output current flowing out of the output terminals has a value corresponding to the input current flowing into the input terminal.

With such an arrangement, when the input voltage V1 is applied to the input terminal 13, the input current I1 flows into the input terminal 13, and the output current −I2 flows out from the output terminal 15. The output terminal −I2 and the load impedance $Z_L$ sets the output voltage V2 at the output terminal 15 at a fixed value, and under this condition the circuit is in a stable state. In a stable state, the voltages V1 and V2 are equal to each other. The current flowing into the input terminal 13 is positive in polarity, while the current flowing out from the output terminal 15 is negative in polarity.

In such a stable circuit state, if the input voltage V1 rises, $$V1 > V2,$$

Then, the output signal of the comparator 33 is low in logical level. The result is that the PNP transistor Q22 in the emitter follower circuit 31 is ON, while the NPN transistor Q21 is OFF. The current I1 flowing from the input terminal 13 into the emitter follower circuit 31 flows through the PNP transistor Q22 in an ON state. If the common emitter current amplification factor $\beta_p$ is satisfactorily large, the collector current Ia of the PNP transistor Q22 is equal to the input current I1. And the following relation holds $$Ia = I1 \tag{21}$$

The collector current of the PNP transistor Q22 flows into the second current mirror circuit 22. Assume now that the current transfer ratio in the second current mirror circuit 22 is r2, and the base currents of the NPN transistors Q12 and Q13 in the second current mirror circuit 22 are negligible. A current r2·Ia flows at the output terminal of the second current mirror circuit 22. The output current of the second current mirror circuit 22 serves as an input current to the third current mirror circuit 12a. Assume again that the current transfer ratio in the third current mirror circuit is r3 and the base currents of the PNP transistors Q2a and Q3a in the circuit 12a are negligible. Under this condition, a current r2·r3·Ia flows out of the output terminal of the circuit 12a. At this time, the NPN transistor Q21 in the emitter follower circuit 31 is OFF, and its collector current is zero. Then, the output currents of the first and second current mirror circuits 12 and 22a are both zero. Therefore, the current −I2 flowing into the output terminal 15 is equal to the output current r2·r3·Ia of the third current mirror circuit 12a. And the following equation holds $$-I2 = r2 \cdot r3 \cdot Ia \tag{22}$$

Substituting the relation (21) into the relation (22), we have the following equation (23)

$$-I2 = r2 \cdot r3 \cdot I1 \tag{23}$$

Since the load impedance connected to the output terminal 15 is $Z_L$, the output current I2 and the output voltage V2 are related by $$Z_L = \frac{V2}{-I2} \tag{24}$$

When the input voltage V1 rises, the second and third current mirror circuits 22 and 12a operate and the current at the output terminal 15 increases and then the output voltage V2 also increases. Until the voltages V1 and V2 are equal to each other and then the output voltage of the voltage comparator 33 is inverted to a logical high, the current −I2 at the output terminal 15 is increased by the current flowing through a path including the PNP transistor Q22 and the second and third current mirror circuits 22 and 12a. Finally, the voltage V2 is equal to the voltage V1. That is to say, the following relation holds between the input voltage V1 and the output voltage V2

$$V1 = V2 \tag{25}$$

The impedance as seen from the input terminal 13 applied with the input voltage V1 is expressed by $$Zin = \frac{V1}{I1} \tag{26}$$

Rewriting the relations (23), (24) and (25) using the relation (26), we have $$Z_{in} = \frac{r2 \cdot r3 \cdot V2}{-I2} \quad (27)$$

$$= \Gamma \cdot Z_L$$

In the above, the proportional coefficient (conversion coefficient) is r2·R3. The equation (27) teaches that the input impedance Zin is proportional to the load impedance $Z_L$ (output impedance).

Assume now that in the circuit being in a stable state, the input voltage V1 drops, i.e. V1<V2. Therefore, the output signal of the voltage comparator 33 is logical high. Then, the NPN transistor Q21 in the emitter follower circuit 31 is ON, and the PNP transistor Q22 is OFF. The current −I1 flowing from the input terminal 13 into the emitter follower circuit 31 flows through the NPN transistor in an ON state. As in the previous case, if the common emitter current amplification factor $\beta_N$ is satisfactorily large, the collector current Ib of the NPN transistor Q21 is equal to −I1, and is $$Ib = -I1 \quad (28)$$

The collector current of the NPN transistor Q21 serves as an input current to the first current mirror circuit 12. Assume that the current transfer ratio in this circuit 12 is r1, and the base currents of the PNP transistors Q2 and Q3 in the circuit 12 are negligible. Then, a current r1·Ib is derived from the output terminal. The output current of the first current mirror circuit 12 serves as an input current to the fourth current mirror circuit 22a. Further, assume now that the current transfer ratio of the circuit 22a is r4, and the base currents of the NPN transistors Q12a and Q13a in the circuit 22a are satisfactorily small. Then, the current r1·r4·Ib flows at the output terminal of the circuit 22a. At this time, the PNP transistor in the emitter follower circuit 31 is OFF and the collector current thereof is zero. Therefore, the output currents of the second and third current mirror circuits 22 and 12a are zero. The current I2 flowing into the output terminal 15 is equal to the output current r1·r4 of the fourth current mirror circuit 22a, and is $$I2 = r1 \cdot r4 \cdot Ib \quad (29)$$

Substituting the equation (28) into the equation (29), we have $$I2 = -r1 \cdot r4 \cdot I1 \quad (30)$$

According to a similar manner to that as at the rise time of the voltage V1, we have the input impedance Zin $$Z_{in} = \frac{V1}{I1} = \frac{r1 \cdot r4 \cdot V2}{-I2} = \Gamma \cdot Z_L \quad (31)$$

In the above relation, r1=r3 and r2=r4, and the proportional coefficient $\Gamma$ is r1·r4 (=r2·r3). As seen from the equation (31), the input impedance Zin is proportional to the load impedance $Z_L$.

In FIG. 17, the terminal 13 is used as an input terminal applied with the input voltage V1, and the terminal 15 is used as an output terminal connected to the load of $Z_L$. Alternatively, the terminal 15 is used as an input terminal supplied with the input voltage V2, and the terminal 13 is used as an output terminal connected to the load of $Z_L$.

Figure 18:
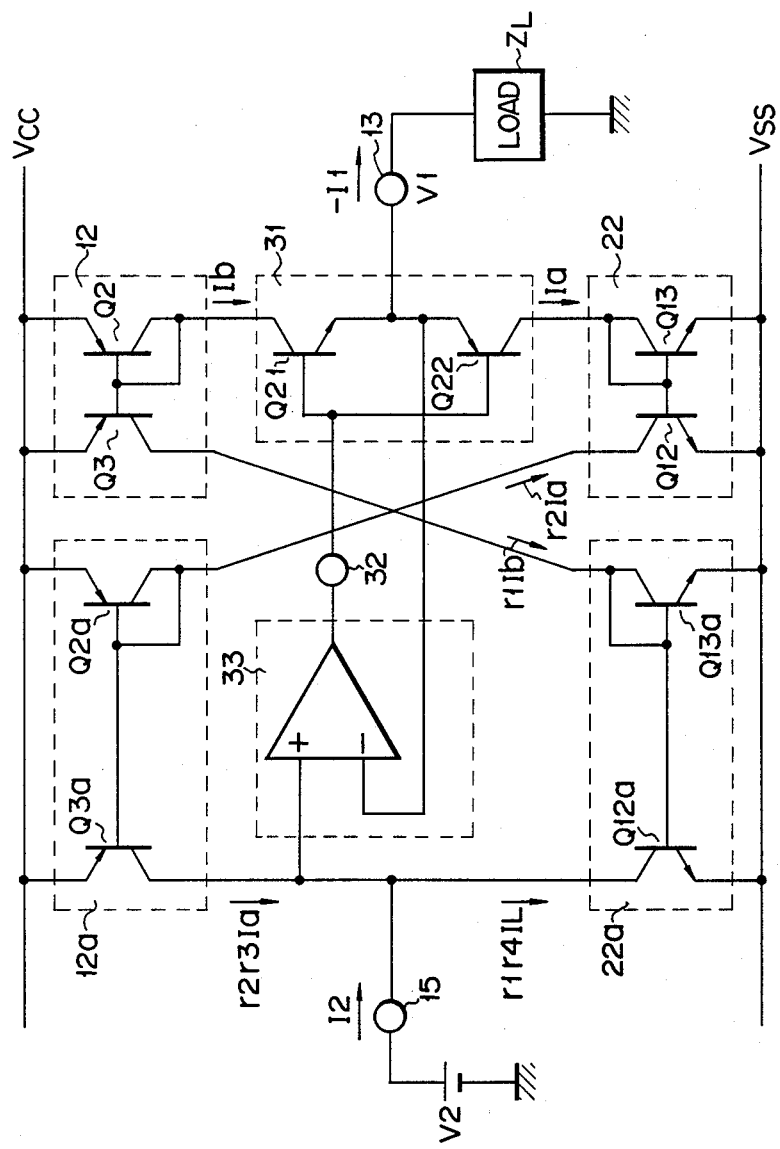
FIG. 18 is a circuit diagram of a modification of the FIG. 17 circuit in which the input and output terminals are interchanged.

In the circuit arrangement as shown in FIG. 18, assume that the voltages V2 and V1, and the currents I2 and I1 are stable, and that under this condition the input voltage V2 rises. Then, V2>V1, and the output signal from the voltage comparator 33 is logical high. In this case, the collector current Ib of the NPN transistor Q21 at the terminal 15 is increased by the current flowing through the path including the NPN transistor Q21 in the emitter follower circuit 31, and the first and fourth current mirror circuits 12 and 22a, as previously described relating to the case that when the input voltage V1 is applied to the terminal 13, the voltage V1 drops from its stable state. At this time, the following relation holds $$I2 = r1 \cdot r4 \cdot Ib \quad (32)$$

The input impedance as seen from the input side is given $$Z_{in} = \frac{V2}{I2} = \frac{V1}{-r1 \cdot r4 \cdot I1} \quad (33)$$

$$= \frac{1}{\Gamma} \cdot Z_L \left( \because Z_L = \frac{V1}{-I1} \right)$$

This equation shows that the input impedance Zin is proportional to the load impedance $Z_L$, with the proportional coefficient 1/Γ (Γ=r1·r4).

Contrary to the above case, assume now that the input voltage V2 drops. In this case, the output voltage comparator 33 is logical low in level. The collector current Ia of the PNP transistor 22 flows into the terminal 15, through a path including the PNP transistor Q22 in the emitter follower circuit 31 and the second and third current mirror circuits 22 and 12a. Therfore, the following equation holds $$I2 = -r2 \cdot r3 \cdot Ia \quad (34)$$

The input impedance as seen from the input terminal 1 is given by $$Z_{in} = \frac{V2}{I2} \quad (35)$$

$$= \frac{V1}{-r2 \cdot r3 \cdot I1}$$

$$= \frac{1}{\Gamma} \cdot Z_L$$

In the above equation, r1=r3 and r2=r4. The equation (35) indicates that the input impedance Zin is proportional to the load impedance $Z_L$, with the proportional coefficient of 1/Γ.

As seen from the description of the FIGS. 17 and 18 circuits, each of the terminals 13 and 15 in the circuit of FIG. 17 may be used as an input terminal or an output terminal. FIG. 19A shows a block diagram of the FIG. 17 circuit when the terminal 13 is used for the input terminal and the terminal 15 for the output terminal. FIG. 19B shows a block diagram of the FIG. 18 circuit when the terminal 13 is used for the output terminal and the terminal 15 for the input terminal. In this case, the proportional coefficient is (=1/Γ).

The FIG. 17 circuit may be used in a manner that the current is fed into the terminal 13, and the current is derived from the terminal 15, and vice versa. In other words, the FIG. 17 circuit allows a bidirectional current flow. FIG. 20A is a block diagram of the FIG. 17 circuit when the input current I is input to the terminal 13, and finally the current ΓI is fed to the load impedance $Z_L$ through the terminal 15. FIG. 20B is a block diagram of the FIG. 17 circuit when the current ΓI is fed through the load impedance $Z_L$ to the terminal 15 and finally the current I is output from the terminal 13. This implies that when a capacitor is used as a load impedance $Z_L$, the FIG. 17 circuit operates as an impedance conversion circuit both during the charge and discharge periods.

FIG. 21 shows another embodiment of an impedance conversion circuit according to the present invention. This embodiment is different from the FIG. 17 circuit in that the voltage comparator 33 is removed, and the base interjunction of the transistors Q21 and Q22 is directly connected to the terminal 15. In operation, there is produced between the terminals 13 and 15 an error voltage corresponding to the base-emitter voltage $V_{BE}$ of the transistor Q21 or Q22. Also in this embodiment, each of the terminals 13 and 15 may be used as an input or output terminal. Further, the input impedance Zin is proportional to the output impedance $Z_L$.

FIG. 22 shows a further embodiment of an impedance conversion circuit according to the present invention. In the bipolar type integrated circuits, the β value of the PNP transistor is generally smaller than that of the NPN transistor. The small β value is undesirable becuase the error tends to occur. The embodiment of FIG. 22 is designed so as to solve this problem. In this embodiment, a combination of a PNP transistor Q23 and an NPN transistor Q24 is used in place of the PNP transistor Q22 in the emitter follower circuit 31 of the FIG. 17 circuit, thereby to substantially improve the β value of the PNP transistor Q22. Specifically, the PNP transistor Q23 is connected at the emitter to the input terminal 13, and at the base to the base of the transistor Q21. The NPN transistor Q24 is connected at the emitter to the collector of the transistor Q13, and at the base to the collector of the transistor Q3. This circuit arrangement is also applicable for the FIG. 17 circuit.

Figure 23A:
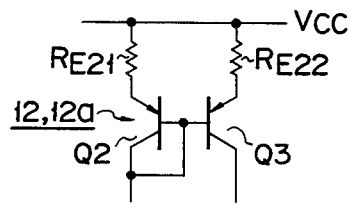
FIGS. 23A to 23D are circuit diagrams of the current mirror circuits used in the FIGS. 17, 18, 21 and 22 circuits.
Figure 23B:
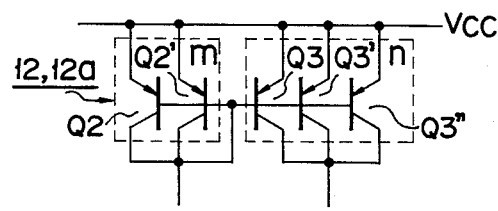
Figure 23C:
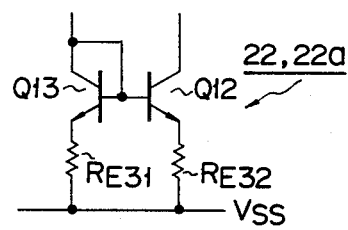
Figure 23D:
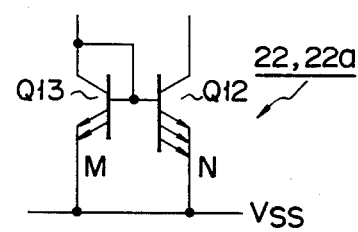

FIGS. 23A to 23D respectively show first to fourth current mirror circuits 12, 22, 12a and 22a in which the current transfer ratios r1 to r4 are set at desired values. The circuits of FIGS. 23A and 23B respectively correspond to the first and third current mirror circuits 12 and 12a using PNP transistors. FIGS. 23C and 23D respectively correspond to the third and fourth current mirror circuits 22 and 22a using NPN transistors. In the FIG. 23A circuit, emitter resistors $R_{E21}$ and $R_{E22}$ are respectively inserted between the emitters of the transistors Q2 and Q3 and the positive power source Vcc.

$r > 1$ when $R_{E21} > R_{E22}$.

$r = 1$ when $R_{E22} = R_{E22}$.

$0 < r < 1$ when $R_{E21} < R_{E22}$.

In the FIG. 23B circuit, there are provided a pair of NPN transistor circuits for input and output. One of the circuit is comprised of NPN transistor Q2 and Q2' arranged in parallel, and the other circuit, NPN transistor Q3, Q3' and Q3" arranged in parallel. With this arrangement, the emitter area ratio of the transistor circuits is set to m:n $0 < r < 1$ when $m > n$.

$r = 1$ when $m = n$.

$r > 1$ when $m < n$.

The FIG. 23C circuit is so arranged that emitter resistors $R_{E31}$ and $R_{E32}$ are inserted between the emitters of the NPN transistors Q13 and Q12 and the negative power source Vss, as in the FIG. 23A circuit. The FIG. 23D circuit employs multi-emitter type transistors for the transistors Q13 and Q12, to set the emitter area ratio of the transistors Q13 and Q12 to m:n. In the FIG. 23C circuit, the current transfer ratio r is determined by a relative magnitude between the emitter resistors $R_{E31}$ and $R_{E32}$. In the FIG. 37D circuit, the current transfer ratio r is determined by the emitter area ratio of the transistors Q13 and Q12.

Figure 24:
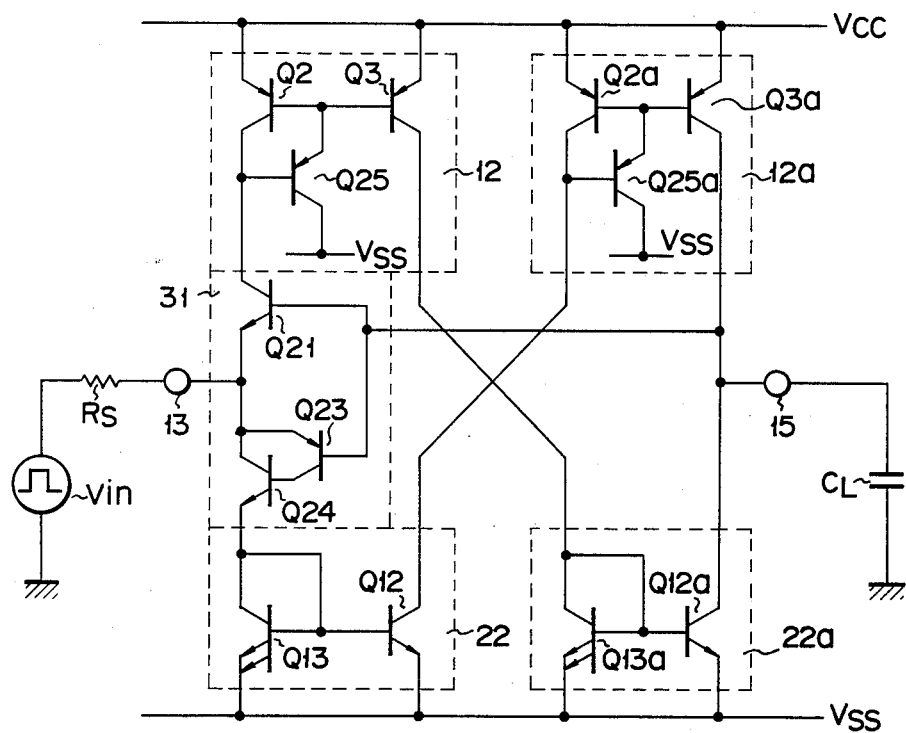
FIG. 24 is a circuit diagram of a test circuit for testing the operation of the FIG. 22 circuit.
Figure 25A:
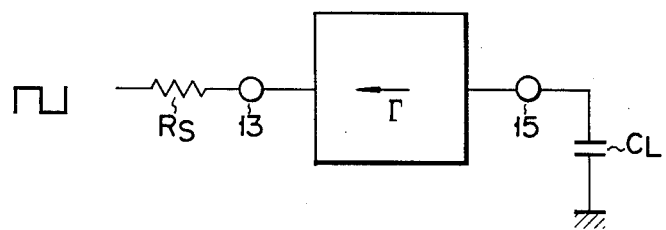
FIGS. 25A and 25B are a block diagram and an equivalent circuit of the FIG. 24 circuit.
Figure 25B:
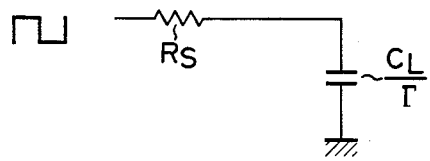
Figure 26A:
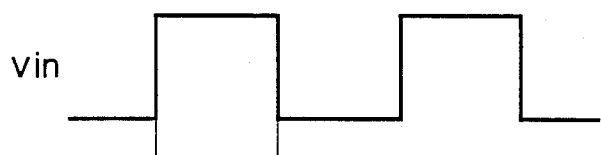
FIGS. 26A and 26B illustrate waveforms of an input voltage Vin and an output voltage V2 of the FIG. 24 circuit.
Figure 26B:
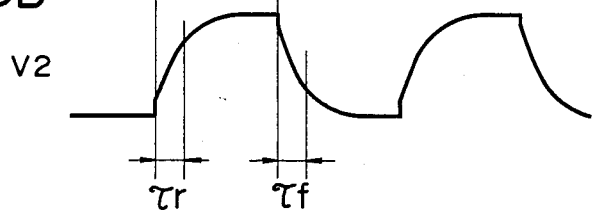

FIG. 24 shows a test circuit for testing a dynamic characteristic of the FIG. 22 circuit. In this test circuit, a pair of PNP transistors Q25 and Q25a for base current compensation are additionally used for improving an accuracy in the first and third current mirror circuits 12 and 12a constructed using PNP transistors. The PNP transistor Q25 is connected at the emitter to the bases of the PNP transistors Q2 and Q3, at the base to the collectors of the transistors Q2 and Q21, and at the collector to the positive power source Vcc. The PNP transistor Q25a is connected at the emitter to the base of the PNP transistors Q2a and Q3a, at the base to the collector of the transistors Q2a and Q12, and at the collector to the negative power source Vss. In the first current mirror circuit 12, the emitter area of the transistors Q2 and Q3 is set at 1:1, and the current transfer ratio r1 is set at 1. Also in the third current mirror circuit 12a, the emitter ratio of the transistors Q2a and Q3a is set at 1:1, and the current transfer ratio r3, at 1. In the second current mirror circuit 22, the emitter area ratio between the transistors Q13 and Q12 is set at 2:1, and the current transfer ratio r2, at 0.5. In the fourth current mirror circuit, the emitter area ratio between the transistors Q13a and Q12a is set at 2:1, and the current transfer ratio r4, at 0.5. In FIG. 24 circuit, the terminal 13 is used as an input terminal, so that the conversion coefficient Γ of the impedance conversion circuit is 0.5. A pulse voltage source Vin is connected to the input terminal 13 through an input resistor Rs of 10 kilo ohms. A capacitor $C_L$ of 0.01 μF is connected to the output terminal 15. In this test circuit, the capacitor $C_L$ as the load is charged at the rise time of the pulse voltage Vin. At the fall time, the capacitor $C_L$ is discharged. In FIG. 24, the input impedance as seen from the input terminal 13 is $$Zin = \frac{\Gamma}{j\omega C} \qquad (36)$$

where $\omega = 2\pi f$ and f is a repetition frequency of the pulse voltage Vin. FIG. 25A is a block diagram of the FIG. 24 circuit with an input impedance as given by the equation (36). FIG. 25B shows an equivalent circuit of the FIG. 25A circuit. As seen from FIGS. 25A and 25B, the FIG. 24 circuit with an impedance conversion circuit with a conversion coefficient Γ provided between the input resistor Rs and the capacitor $C_L$ is equivalent to an arrangement that a capacitance of $C_L/\Gamma$ is connected to the input resistor Rs, as shown in FIG. 25B. The circuit of FIG. 25B constitutes an integrated circuit. When the input pulse voltage Vin as shown in FIG. 26A is applied to the FIG. 24 circuit, the output voltage V2 changes as shown in FIG. 26B. In the circuit, Vcc=10 V, Vss=0 V, f=1 kHz, and an amplitude of the voltage Vin is 10 V. In FIG. 26B, time constants $\tau r$ and $\tau f$ at the rise and fall times are 0.190 msec and 0.185 msec, respectively. These values are each about two times the time constant $R \cdot C_L$ (=0.1 msec) when no impedance conversion circuit is provided.

Those impedance conversion circuits in FIGS. 17, 18, 21, 22 and 24 are of the bidirectional type which is operable even if the input and output terminals are intercharged, and are well adaptable in fabrication for the integrated circuits.

In the above embodiment, the conductivity type of the transistors may be interchanged if proper minor countermeasures, for example, the polarity of the power source voltages are reversed, are taken.

As seen from the foregoing, there is provided an impedance conversion circuit which is well adaptable in fabrication for integrated circuits and has a capacitor proportional to an input impedance.

While some specific embodiments of the invention have been disclosed, it should be understood that the present invention may variously be changed and modified within the scope of the invention.

What is claimed is:

1. An impedance converter comprising:
   input means to which an input voltage is applied;
   output means at which an output voltage corresponding to said input voltage appears;
   load means; and
   impedance conversion means provided between said input and output means, said impedance conversion means comprising:
      voltage to current converter means for converting said input voltage into an electric current, said voltage to current converter means having an input terminal and an output path, said input terminal being connected to said input means for receiving said input voltage, said output path having first and second terminals, and said first terminal being connected to said load means through said output means;
      first current mirror circuit means comprising an input terminal through which an input electric current flows and an output terminal through which an output electric current flows, said output electric current corresponding to said input electric current, and said input terminal of said first current mirror circuit means being connected to said second terminal of said output path of said voltage to current converter means; and
      second current mirror circuit means comprising an input terminal through which an input electric current flows and an output terminal through which an output electric current flows, said last recited output electric current corresponding to said last recited input electric current, and said input terminal of said second current mirror circuit means being connected to said output terminal of said first current mirror circuit means and said output terminal of said second current mirror circuit means being connected to said input means.

2. An impedance converter according to claim 1 wherein said voltage to current converter means comprises a transistor of NPN type whose base constitutes said input terminal, whose emitter constitutes said first terminal of said output path and whose collector constitutes said second terminal of said output path.

3. An impedance converter according to claim 1 wherein said voltage to current converter means comprises a transistor of NPN type whose base constitutes said input terminal, whose emitter constitutes said first terminal of said output path and whose collector constitutes said second terminal of said output path, and wherein said voltage to current converter means further comprises an operational amplifier whose noninverting input terminal is connected to said input means, whose inverting input terminal is connected to said output means and whose output terminal is connected to said base of said transistor.

4. An impedance converter comprising:
   input means comprising first and second input terminals to which first and second input voltages are supplied, respectively;
   output means comprising first and second output terminals on which first and second output voltages appear, respectively;
   load means; and
   impedance conversion means provided between said input means and output means, said impedance conversion means comprising first and second impedance conversion circuits;
   said first impedance conversion circuit comprising:
      first voltage to current converter means for converting said first input voltage to an electric current, said first voltage to current converter means comprising an input terminal and an output path, said input terminal of said first voltage to current converter means being connected to said first input terminal, said output path having first and second terminals, and said first terminal of said output path being connected to said load means through said first output terminal;
      a first constant current source for providing an electric current to said first input terminal; and
      first current mirror circuit means comprising an input terminal through which an input electric current flows and an output electric current flows, said output electric current corresponding to said input electric current, and said input terminal of said first current mirror circuit means being connected to said second terminal of said output path of said first voltage to current converter means;
      a second constant current source for providing an electric current through said output path of said first voltage to current converter means; and
      second current mirror circuit means comprising an input terminal through which an input electric current flows and an output terminal through which an output electric current flows, said last recited output electric current corresponding to said last recited input electric current, and said input terminal of said second current mirror circuit means being connected to said output terminal of said first current mirror circuit means and said output terminal of said second current mirror circuit means being connected to said first input terminal; and
   said second impedance conversion circuit comprising:
      second voltage to current converter means for converting said second input voltage to an electric current, said second voltage to current converter means comprising an input terminal and an output path, said input terminal of said second voltage to current converter means being connected to said second input terminal, said output path of said second voltage to current converter means having first and second terminals, said first terminal of said output path of said second voltage to current converter means being connected to said load means through said second output terminal;

a third constant current source for providing an electric current to said second input terminal; and third current mirror circuit means comprising an input terminal through which an input electric current flows and an output terminal through which an output electric current flows, said last recited output electric current corresponding to said last recited input electric current, and said input terminal of said third current mirror circuit means being connected to said second terminal of said output path of said second voltage to current converter means;

a fourth constant current source for providing an electric current through said output path of said second voltage to current converter means; and fourth current mirror circuit means comprising an input terminal through which an input electric current flows and an output terminal through which an output electric current flows, said last recited output electric current corresponding to said last recited input electric current, and said input terminal of said fourth current mirror circuit means being connected to said output terminal of said third current mirror circuit means, and said output terminal of said fourth current mirror circuit means being connected to said second input terminal.

5. An impedance converter according to claim 4 wherein said first voltage to current converter means comprises a first transistor of NPN type whose base constitutes said input terminal of said first voltage to current converter means, whose emitter constitutes said first terminal of said output path of said first voltage to current converter means, and whose collector constitutes said second terminal of said output path of said first voltage to current converter means, and wherein said second voltage to current converter means comprises a second transistor of NPN type whose base constitutes said input terminal of said second voltage to current converter means, whose emitter constitutes said first terminal of said output path of said second voltage to current converter means, and whose collector constitutes said second terminal of said output path of said second voltage to current converter means.

6. An impedance converter according to claim 4 wherein said first voltage to current converter means comprises a first transistor of NPN type whose base constitutes said input terminal of said first voltage to current converter means, whose emitter constitutes said first terminal of said output path of said first voltage to current converter means, and whose collector constitutes said second terminal of said output path of said first voltage to current converter means, wherein said second voltage to current converter means comprises a second transistor of NPN type whose base constitues said input terminal of said second voltage to current converter means, whose emitter constitutes said first terminal of said output path of said second voltage to current converter means and whose collector constitutes said second terminal of said output path of said second voltage to current converter means, wherein said first voltage to current converter means further comprises a first operational amplifier whose noninverting input terminal is connected to said first input terminal, whose inverting input terminal is connected to said first output terminal and whose output terminal is connected to said base of said first transistor, and wherein said second voltage to current converter means further comprises a second operational amplifier whose noninverting input terminal is connected to said second input terminal, whose inverting input terminal is connected to said second output terminal and whose output terminal is connected to said base of said second transistor.

7. An impedance converter comprising:
input means to which an input voltage is supplied;
output means at which an output voltage corresponding to said input voltage appears; and
load means;
impedance conversion means provided between said input means and output means, said impedance conversion means comprising:
an input circuit comprising a first transistor having a base and an electric current path, said electric current path having first and second terminals, said base being connected to said load means through said output means, and said first terminal of said current path being connected to said input means;
first current mirror circuit means comprising an input terminal through which an input electric current flows and an output terminal through which an output electric current flows, said output electric current corresponding to said input electric current, and said input terminal being connected to said second terminal of said current path of said first transistor; and
second current mirror circuit means comprising an input terminal through which an input electric current flows and an output terminal through which an output electric current flows, said last recited output electric current corresponding to said last recited input electric current, said input terminal of said second current mirror circuit means being connected to said output terminal of said first current mirror circuit means and said output terminal of said second current mirror circuit means being connected to said output means.

8. An impedance converter according to claim 7 wherein said first transistor is of NPN type whose emitter constitutes said first terminal of said current path of said first transistor and whose collector constitutes said second terminal of said current path of said first transistor.

9. An impedance converter according to claim 7 wherein the current transfer ratios of said first and second current mirror circuit means are more than 1, or less than 1, according to a ratio of the output currents of said first current mirror circuit and said second current mirror circuit.

10. An impedance converter comprising:
input means to which an input voltage is supplied;
load means;

output means at which an output voltage corresponding to said input voltage appears, said load means connected to said output means; and impedance conversion means provided between said input means and output means, said impedance conversion means comprising:

an input circuit of an emitter follower type having an input terminal, an electric current path and a control terminal, said input terminal being connected to said input means;

first current mirror circuit means comprising an input terminal through which an input electric current flows, and an output terminal through which an output electric current flows, said output electric current corresponding to said input electric current, and said input terminal being connected to one terminal of said current path of said input circuit;

second current mirror circuit means comprising an input terminal through which an input electric current flows and an output terminal through which an output electric current flows, said last recited output electric current corresponding to said last recited input electric current, and said input terminal of said second current mirror circuit means being connected to said output terminal of said first current mirror circuit means and said output terminal of said second current mirror circuit means being connected to said output means;

third current mirror circuit means comprising an input terminal through which an input electric current flows, and an output terminal through which an output electric current flows, said last recited output electric current corresponding to said last recited input electric current, and said input terminal of said third current mirror circuit means being connected to the other terminal of said current path of said input circuit;

fourth current mirror circuit means comprising an input terminal through which an input electric current flows, and an output terminal through which an output electric current flows, said last recited output electric current corresponding to said last recited output input electric current, said input terminal of said fourth current mirror circuit means being connected to said output terminal of said third current mirror circuit means and said output terminal of said fourth current mirror circuit being connected to said output means; and voltage comparator means for comparing said input voltage and said output voltage, and supplying a signal according to the result of the comparison to said control terminal of said input circuit, said voltage comparator means having a noninverting input terminal connected to said output means, an inverting input terminal connected to said input means and an output terminal connected to said control terminal of said input circuit.

11. An impedance converter according to claim 10, wherein said input circuit comprises two complementary conductivity type transistors, whose emitters are connected together and constitute said input terminal of said input circuit, and whose bases are connected together and constitute said control terminal of said input circuit, the collector of one of said two transistors constituting one terminal of said current path of said input circuit, and the collector of the other of said two transistors constituting the other terminal of said current path of said input circuit.

12. An impedance converter according to claim 10, wherein the ratios of said input and output currents of said first and fourth current mirror circuit means are substantially equal to each other, and wherein the ratios of said input and output currents of said second and third current mirror circuit means are substantially equal to each other.

13. An impedance converter comprising:
input means to which an input voltage is supplied;
load means;
output means at which an output voltage corresponding to said input voltage appears; and
impedance conversion means provided between said input means and output means, said impedance conversion means comprising:

an input circuit of an emitter follower type having an input terminal, an electric current path and a control terminal, said input terminal being connected to said input means, said control terminal being connected to said output means;

first current mirror circuit means comprising an input terminal through which an input electric current flows, and an output terminal through which an output electric current flows, said output electric current corresponding to said input electric current, and said input terminal being connected to one terminal of said current path of said input circuit;

second current mirror circuit means comprising an input terminal through which an input electric current flows, and an output terminal through which an output electric current flows, said last recited output electric current corresponding to said last recited input electric current, said input terminal of said second current mirror circuit means being connected to said output terminal of said first current mirror circuit means and said output terminal of said second current mirror circuit means being connected to said output means;

third current mirror circuit means comprising an input terminal through which an input electric current flows, and an output terminal through which an output electric current flows, said last recited output electric current corresponding to said last recited input electric current, and said input terminal of said third current mirror circuit means being connected to the other terminal of said current path of said input current; and fourth current mirror circuit means comprising an input terminal through which an input electric current flows, and an output terminal through which an output electric current flows, said last recited output electric current corresponding to said last recited input electric current, said input terminal of said fourth current mirror circuit means being connected to said output terminal of said third current mirror circuit means and said output terminal of said fourth current mirror circuit means being connected to said output means.

14. An impedance converter according to claim 13, wherein said input circuit comprises two complementary conductivity type transistors, whose emitters are connected together and constitute said input terminal of said input circuit, and whose bases are connected together and constitute said control terminal of said input circuit, the collector of one of said two transistors constituting said one terminal of said current path of said input circuit, and the collector of the other of said two transistors constituting the other terminal of said current path of said input circuit.

15. An impedance converter according to claim 13, wherein the ratios of said input and output currents of said first and fourth current mirror circuit means are substantially equal to each other, and wherein the ratios of said input and output currents of said second and third current mirror circuit means are substantially equal to each other.

* * * * *

UNITED STATES PATENT AND TRADEMARK OFFICE
CERTIFICATE OF CORRECTION

PATENT NO. : 4,591,739

DATED : May 27, 1986

INVENTOR(S) : KATSUMI NAGANO

It is certified that error appears in the above-identified patent and that said Letters Patent is hereby corrected as shown below:

Claim 10, line 50, after "circuit" insert -- means --.

Signed and Sealed this

Twenty-fifth Day of November, 1986

Attest:

DONALD J. QUIGG

Attesting Officer      *Commissioner of Patents and Trademarks*